United States Patent
Koay et al.

(10) Patent No.: US 6,806,583 B2
(45) Date of Patent: Oct. 19, 2004

(54) LIGHT SOURCE

(75) Inventors: Huck Khim Koay, Georgetown Penang (MY); Seong Choon Lim, Penang (MY); Cheng Why Tan, Bukit Tengah Bukit Mertajam Penang (MY); Gurbir Singh A/L Balwant Singh, Island Park Georgetown Penang (MY); Chee Keong Chong, Perai Penang (MY); Sundar a/l Natarajan Yoganandan, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 53 days.

(21) Appl. No.: 09/888,857

(22) Filed: Jun. 25, 2001

(65) Prior Publication Data

US 2002/0047130 A1 Apr. 25, 2002

(30) Foreign Application Priority Data

Jun. 28, 2000 (MY) ..................................... PI 20002918

(51) Int. Cl.$^7$ ............................................... H01L 23/28
(52) U.S. Cl. ..................... 257/787; 257/594; 257/618; 257/622; 257/678; 257/773; 257/774
(58) Field of Search ................................ 257/594, 618, 257/622, 678, 773, 774, 787, 78, 79, 80, 81, 88, 87, 91, 98, 99, 777, 778, 784, 790; 438/40

(56) References Cited

U.S. PATENT DOCUMENTS

| | | | | |
|---|---|---|---|---|
| 5,221,641 A | * | 6/1993 | Kurita et al. .................. 438/27 |
| 5,298,768 A | * | 3/1994 | Okazaki et al. ................ 257/81 |
| 5,407,502 A | * | 4/1995 | Takenaka et al. ......... 156/89.15 |
| 5,656,847 A | * | 8/1997 | Okazaki et al. .............. 257/433 |
| 5,777,433 A | * | 7/1998 | Lester et al. ................. 313/512 |
| 5,786,626 A | * | 7/1998 | Brady et al. ................. 257/673 |
| 5,835,269 A | | 11/1998 | Natori ......................... 358/448 |
| 5,959,316 A | * | 9/1999 | Lowery ........................ 257/98 |
| 6,045,240 A | * | 4/2000 | Hochstein .................... 362/294 |
| 6,054,716 A | * | 4/2000 | Sonobe et al. .............. 250/552 |
| 6,069,440 A | * | 5/2000 | Shimizu ...................... 313/486 |
| 6,104,095 A | * | 8/2000 | Shin et al. ................... 257/787 |
| 6,355,946 B1 | * | 3/2002 | Ishinaga ...................... 257/98 |
| 6,407,411 B1 | * | 6/2002 | Wojnarowski et al. ......... 257/99 |
| 6,459,130 B1 | * | 10/2002 | Arndt et al. ................. 257/432 |
| 6,603,148 B1 | * | 8/2003 | Sano et al. ................... 257/98 |
| 2001/0022390 A1 | * | 9/2001 | Waitl et al. ................. 257/666 |

* cited by examiner

*Primary Examiner*—Amir Zarabian
*Assistant Examiner*—Ida M. Soward

(57) ABSTRACT

A light source suitable for surface mounting onto a printed circuit board. The light source includes a planar substrate with a centrally positioned recess. A light emitting diode is mounted in the recess and the substrate is encapsulated by a transparent encapsulant material forming an ellipsoidal dome over the light emitting diode.

2 Claims, 13 Drawing Sheets

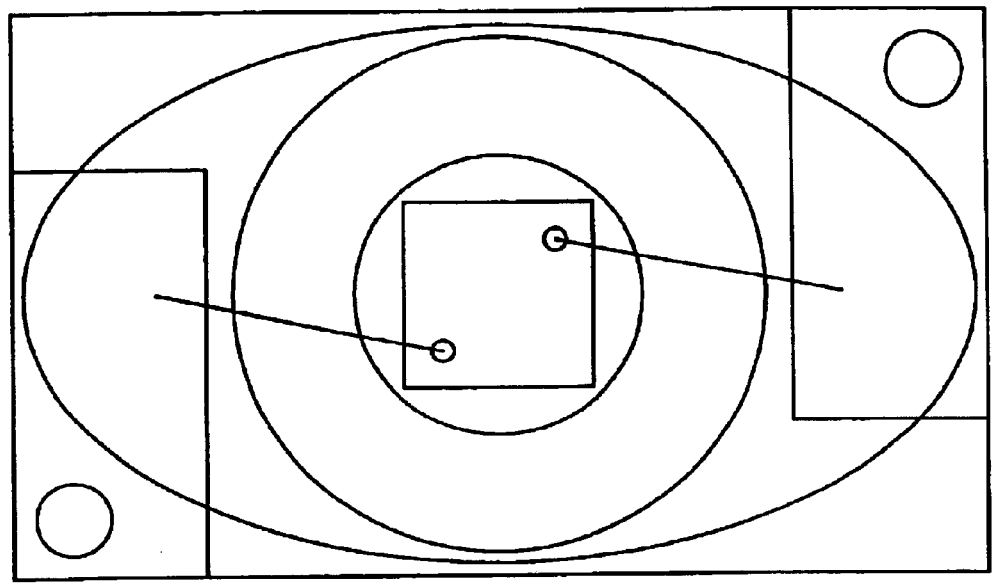
FIG 18
FIG 19
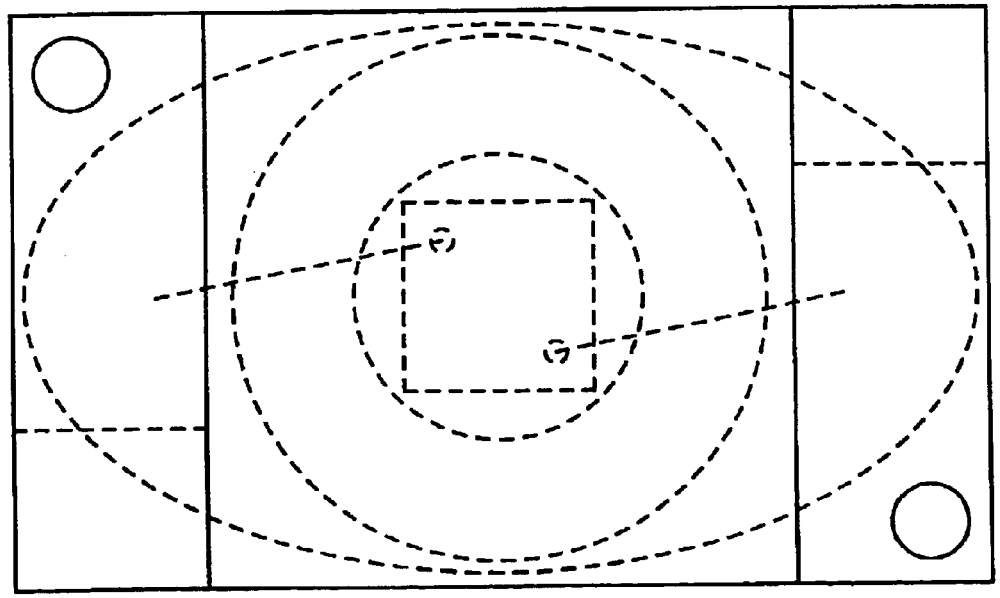

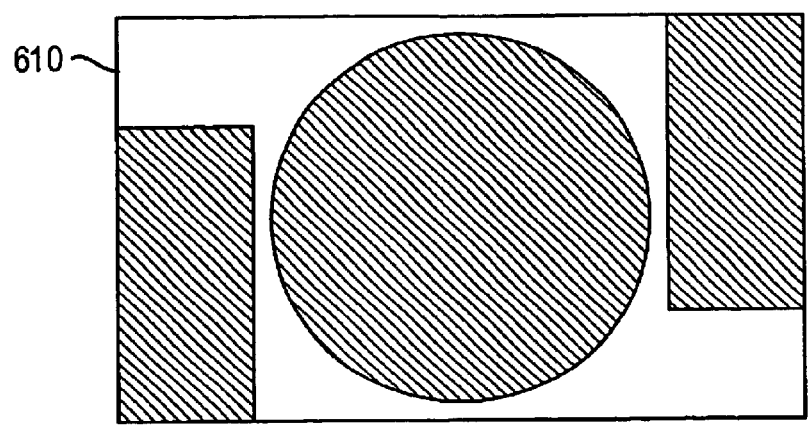
FIG 21
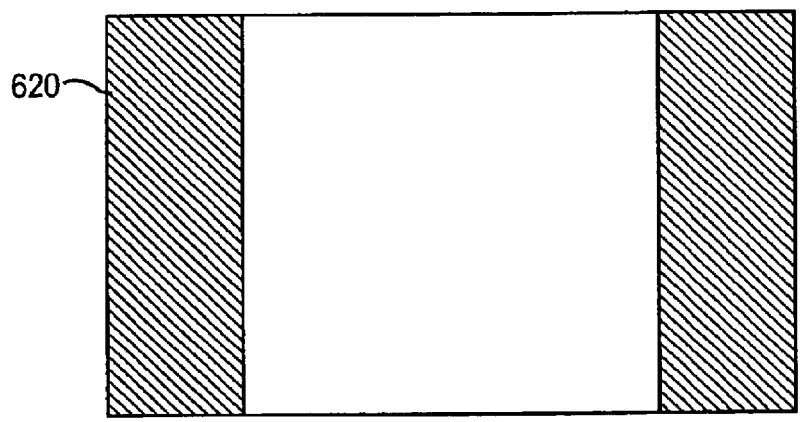
FIG 22
FIG 23
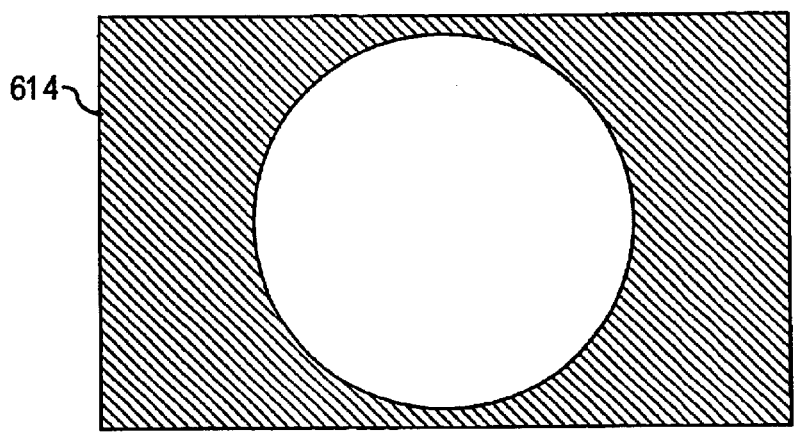

LIGHT SOURCE

BACKGROUND OF THE INVENTION

This invention relates to a light source. In particular, the invention relates to a light source in the form of a light emitting diode (LED) package suitable for use in an LED matrix video display.

Light emitting diodes (LEDs) fabricated from silicon wafer are commonly used to generate light in a variety of applications ranging from simple low-power indication lights to higher-power LED traffic light clusters and LED matrix video displays. Typically, the light emitting diode die is assembled into a sealed package containing electrical connections between the die and terminal pads exposed on an outer surface of the package. Such a package enables simple connection of the diode to external circuitry and, due the sealing properties of the package, protects the die from external damage.

Recently, there has been a drive to make smaller surface mount LED packages which allow the LED to be reliably mounted onto a printed circuit board substrate at relatively high speeds. By making individual LED packages smaller, the number of LED dies per unit area in a multiple LED package may be increased. Furthermore, when the LED is mounted onto a circuit board, the thickness of the assembled circuit board can be reduced.

One application of small surface mount LED packages is in the field of large-scale video displays or video walls that are often found on the outside of large buildings or at large sporting arenas. The level of luminosity of such a video display needs to be as high as possible in order for the display to have good contrast and to appear highly visible to spectators. In view of this need, the increased LED area density provided by surface mount LED packages is significant as it can lead to more light being generated per unit area of the display. Furthermore, the use of surface mount LED packages to increase the LED area density of the display also improves the maximum pixel resolution that may be achieved by the display.

Today's surface mount LED packages are available in a wide variety of configurations. FIG. 1 shows one typical surface mount LED package 100 comprising an LED die 110 mounted on a circuit board substrate 120 with a transparent material 130 encapsulating the LED 110. The package includes a pair of conductive interconnects 140, 142 for coupling the LED to external circuitry. A first electrode on the bottom surface of the LED 110 is mounted on and electrically coupled to one of the pair of conductive interconnects 140. A very small wire 144 is then "bonded" or welded at one end to a second electrode on the top surface of the LED 110, and at the other end to the other one of the pair of conductive interconnects 142.

A characteristic of the package of FIG. 1 is that light generated by the LED has a relatively wide directivity. Accordingly, when this type of LED package is incorporated into a video display, the video display will have a relatively wide angle of view in both horizontal and vertical directions. However, a problem with the wide directivity of the LED package is that the light energy emitted by the LED is distributed over a larger angle making the LED appear dimmer in the forward viewing direction. Therefore, video displays incorporating the LED package of FIG. 1 will accordingly appear dimmer to spectators. Video displays are known to require only a viewing angle of around 60 degrees in the horizontal plane and around 30 degrees, in the vertical plane.

In order to overcome the drawbacks of using known surface mount LEDs in video matrix displays, U.S. Pat. No. 5,835,269 assigned to Sony Corporation, Japan, proposes using an video display apparatus with a unitary reflecting member in the form of a corrugated sheet. The corrugated sheet compensates for the wide directivity of known surface mount LEDs by reflecting stray light back into the forward viewing direction. However, the use of additional structure in the video display adds cost and complexity to the manufacture of video displays which is undesirable.

What is needed is a light emitting diode package which is optimised for use in video displays such that the light energy emitted by the light source may be concentrated in the forward viewing direction.

SUMMARY OF THE INVENTION

According to a first aspect of the present invention, there is provided a light emitting diode package comprising: a planar substrate having an upper surface and a lower surface, a portion of the upper surface defining a recess, said recess having a side wall tapering outwards towards the upper surface; a light emitting diode mounted in the recess of the substrate; a first electrically-conductive interconnect extending between the upper and lower surfaces, the first interconnect having a terminal on the upper surface coupled to the light emitting diode and an exposed pad on the lower surface for coupling to external circuitry; a second electrically-conductive interconnect extending between the upper and lower surfaces, the second interconnect having a terminal on the upper surface coupled to the light emitting diode and a conductive pad on the lower surface for coupling to external circuitry; and a transparent encapsulant material bonded to the first surface of the substrate to encapsulate the light emitting diode, the encapsulant material being molded to form a focussing ellipsoidal dome over the light emitting diode.

A light emitting diode package in accordance with the invention has the advantage that light energy emitted by the light emitting diode is concentrated by a combination of reflection from the walls of the substrate recess and by refraction from the focussing ellipsoidal dome. The light emitting diode package also provides the additional advantage that by mounting the light emitting diode in the recess of the substrate the package occupies a smaller volume.

Preferably, the focussing ellipsoidal dome is shaped to concentrate light within a range of angles in the horizontal and vertical planes. The light emitting diode package is thus optimised for use in LED matrix video displays that require only certain viewing angles in the horizontal and vertical planes.

In a preferred embodiment, the side wall of the recess is plated with a metallic layer presenting a silvered reflective surface to the light emitting diode. The silvered reflective surface provides improved reflectivity over previously employed gold layers which present a golden appearance to the light emitting diode.

Suitably, the metallic layer forms the terminal of the first interconnect.

Ideally, the substrate defines first and second vias extending between the upper and lower surfaces, a portion of each of the first and second interconnects extending through the first and second vias respectively.

Each of the conductive pads of the first and second interconnects may include a gold plated layer for electrically coupling to external circuitry.

BRIEF DESCRIPTION OF THE DRAWINGS

Embodiments of the invention will now be described, by way of example, with reference to the accompanying drawings, in which:

FIG. 18 is a plan view showing the top of the surface mount LED package shown in FIG. 17;

FIG. 19 is a plan view showing the bottom of the surface mount LED package shown in FIG. 17;

FIGS. 21 to 23 are plan views of UV masks employed in the manufacturing process steps shown in FIGS. 6 and 10.

DETAILED DESCRIPTION

Figure 1:
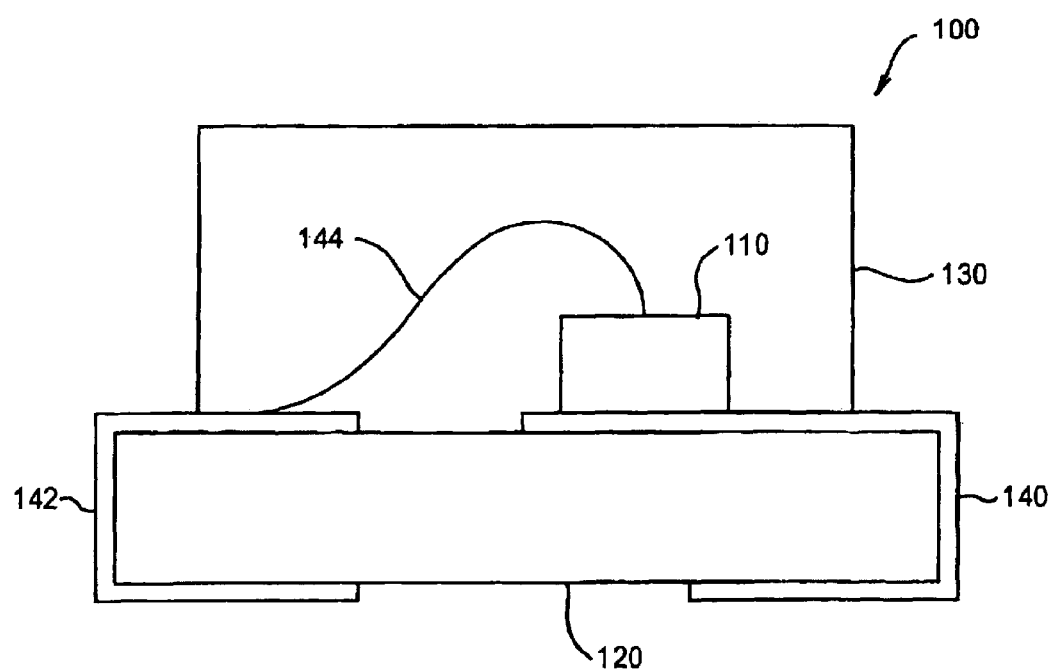
FIG. 1 is a cross-sectional side view of a known surface mount LED package.
Figure 2A:
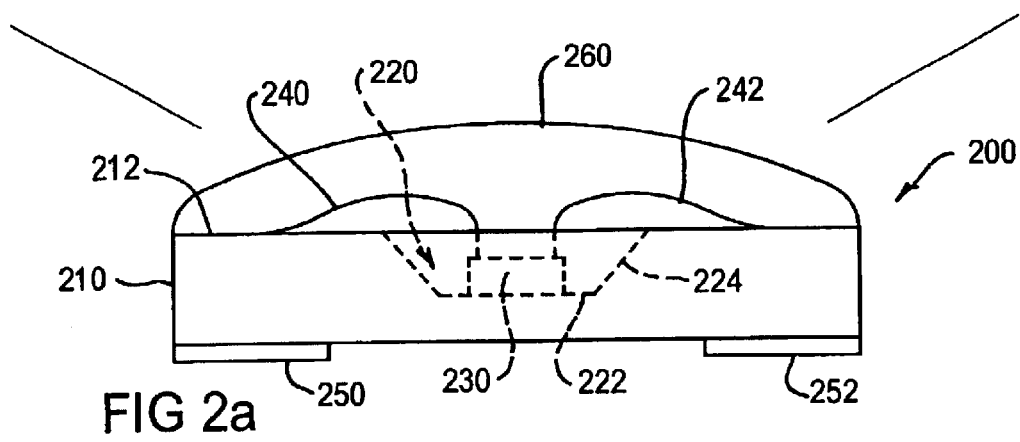
FIG. 2 is an orthogonal projection showing front, plan and side views of a surface mount LED package in accordance with the invention.
Figure 2B:
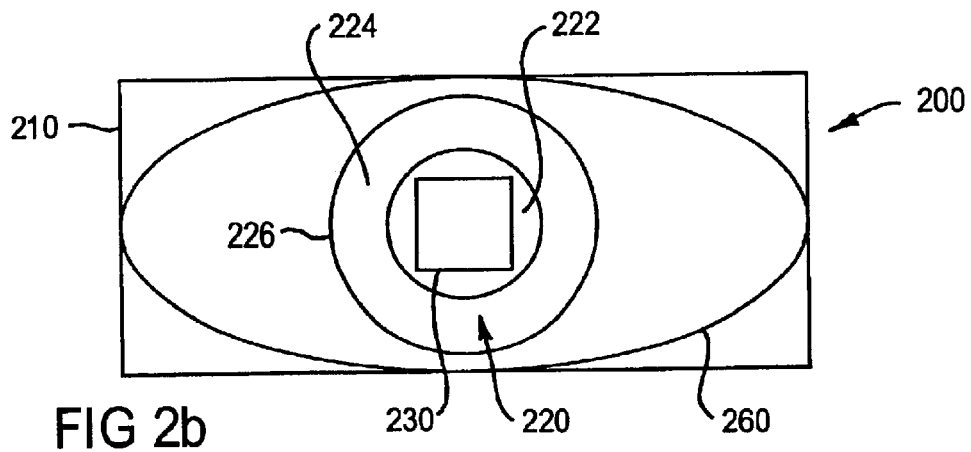
Figure 2C:
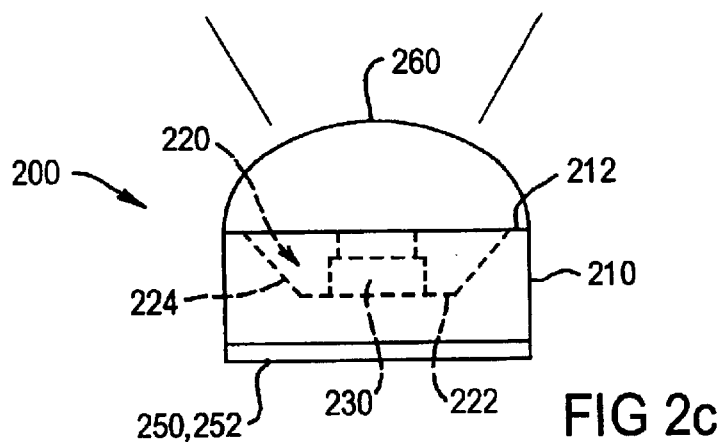

Referring to FIG. 2, there is shown an LED package 200 which can be surface mounted onto a printed circuit board by, for example, reflow soldering or possibly manual soldering. The dimensions of the LED package are preferably 2 millimeters long by 1.25 millimeters wide by 1.2 millimeters tall.

The surface mount LED package 200 includes a rectangular planar substrate 210, such as an epoxy or glass laminate, a polyester or polyamide board, a bismaleimide-traizine (BT) resin board, or a thermosetting polyphenylene ether board. An upper surface 212 of the substrate includes a conic-section shaped recess 220 positioned centrally on the upper surface. The recess 220 comprises a generally circular floor 222, and a curved side wall 224 tapering concentrically outwards from the floor towards a circular edge 226 on the upper surface 212.

The light emitting element of the LED package 200 is provided by a light emitting diode (LED) die 230 which is mounted centrally in the recess 220 of the substrate 210. As illustrated in the front view of the LED package, two thin gold wires 240, 242 are electrically coupled at one end to the LED die 230 in order to supply an electric current across a semiconductor junction of the LED die. The other ends of the gold wires 240, 242 are electrically coupled to respective terminals on the upper surface 212 of the substrate 210.

The terminals on the upper surface 212 are in turn coupled to a pair of conductive pads 250, 252 on a lower surface 214 of the substrate 210 by a pair of electrically conductive vias, further details of which will be described later. The pair of conductive pads 250, 252 which are exposed on the lower surface of the substrate provide two generally planar surfaces suitable for surface mounting the bottom of the LED package onto a printed circuit board.

A transparent or translucent encapsulant material 260 is bonded to the upper surface 212 of the substrate 210 so as to encapsulate the terminals on the upper surface 212, the gold wires 240, 242, and the LED die 230. The encapsulant material is shaped to form a focussing ellipsoidal dome over the light emitting diode. The ellipsoidal shape of the encapsulation dome optimises the surface mount LED package for use in video matrix displays. As illustrated in FIG. 2, the major axis radius of curvature of the ellipse shown in the front view is relatively large so as to provide a wide viewing angle of approximately 120 degrees. Such a wide viewing angle would be ideally configured in the horizontal plane as is well known in the field of video displays. In contrast, the minor axis radius of curvature of the ellipse shown in the side view is relatively small so as to provide a narrow viewing angle of approximately 60 degrees. Such as narrow viewing angle would be ideally configured in the vertical plane as is well known in the field of video displays.

Figure 3:
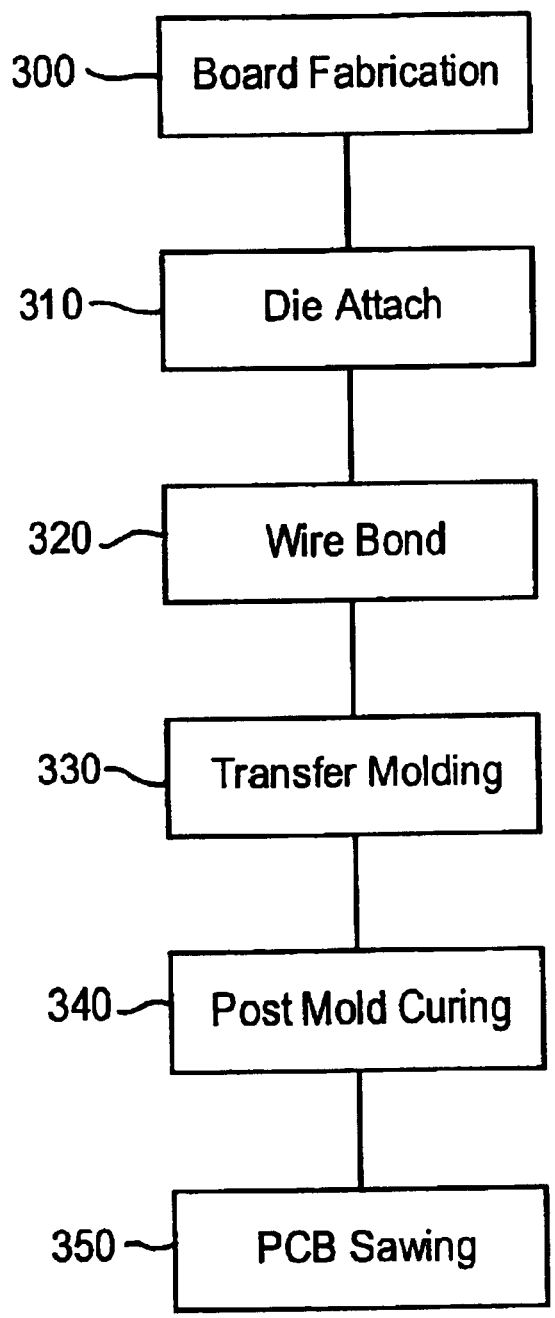
FIG. 3 is a flowchart illustrating exemplary steps employed during the manufacture of the surface mount LED package shown in FIG. 2.

FIG. 3 is a flowchart illustrating, by way of example, the process steps 300 to 350 employed during the manufacture of the surface mount LED package shown in FIG. 2.

In the interests of speed and efficiency, the manufacturing process is actually designed to manufacture multiple surface mount LED packages in one batch. The starting material for the manufacturing process is a large glass-fibre laminate board which is divided into an array or grid of identical rectangular units. Such a board may, for example, be an FR4 type substrate with a glass transition phase of 180 degrees centigrade. Preferably, the board has an array of units 40 units wide by 20 units long, and has dimensions of approximately 70 millimeters by 70 millimeters by 0.4 millimeters.

Each rectangular unit on the board forms the basis of the rectangular substrate 210 of the LED package in FIG. 2. The same processing steps 300, 310, 320, 330, and 340 are applied to each rectangular unit prior to physical separation of the individual units in the sawing step 350. The processing of multiple units on a large board enables the units to be handled more accurately. In the following description, the processing steps will be explained with reference to a single rectangular unit on the board. However, it is understood that the steps will apply to all units on the board.

Board Fabrication

The first step 300 in the manufacturing process involves preparing the units of the board for the die attach step 310. The board fabrication step 300 is illustrated sequentially in FIGS. 4 to 14.

Figure 4:
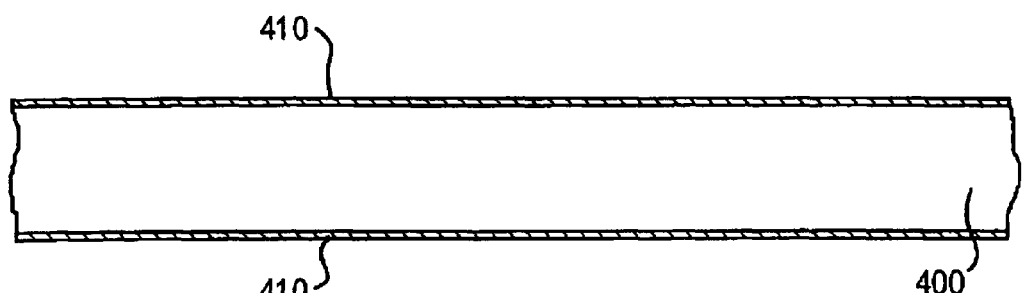
FIGS. 4 to 17 are cross-sectional side views of the surface mount LED package of FIG. 2 at different stages in a manufacturing process.

Referring to FIG. 4, the bare glass-fiber board unit 400 is first plated on the upper and lower surfaces with copper 410 using standard plating techniques.

Figure 5:
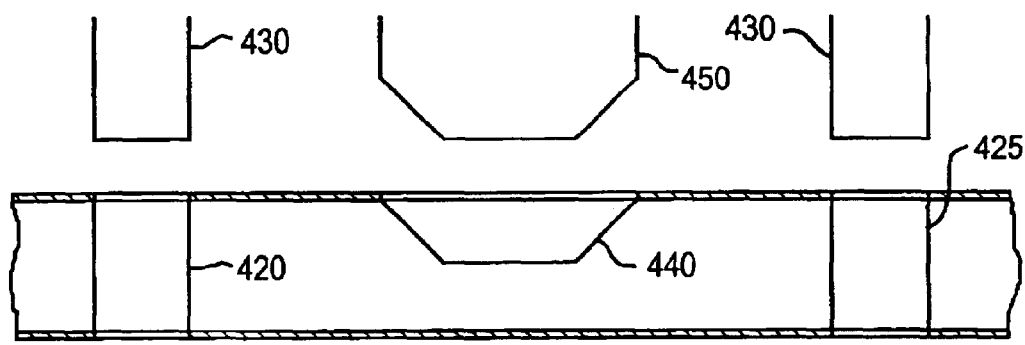
Figure 20:
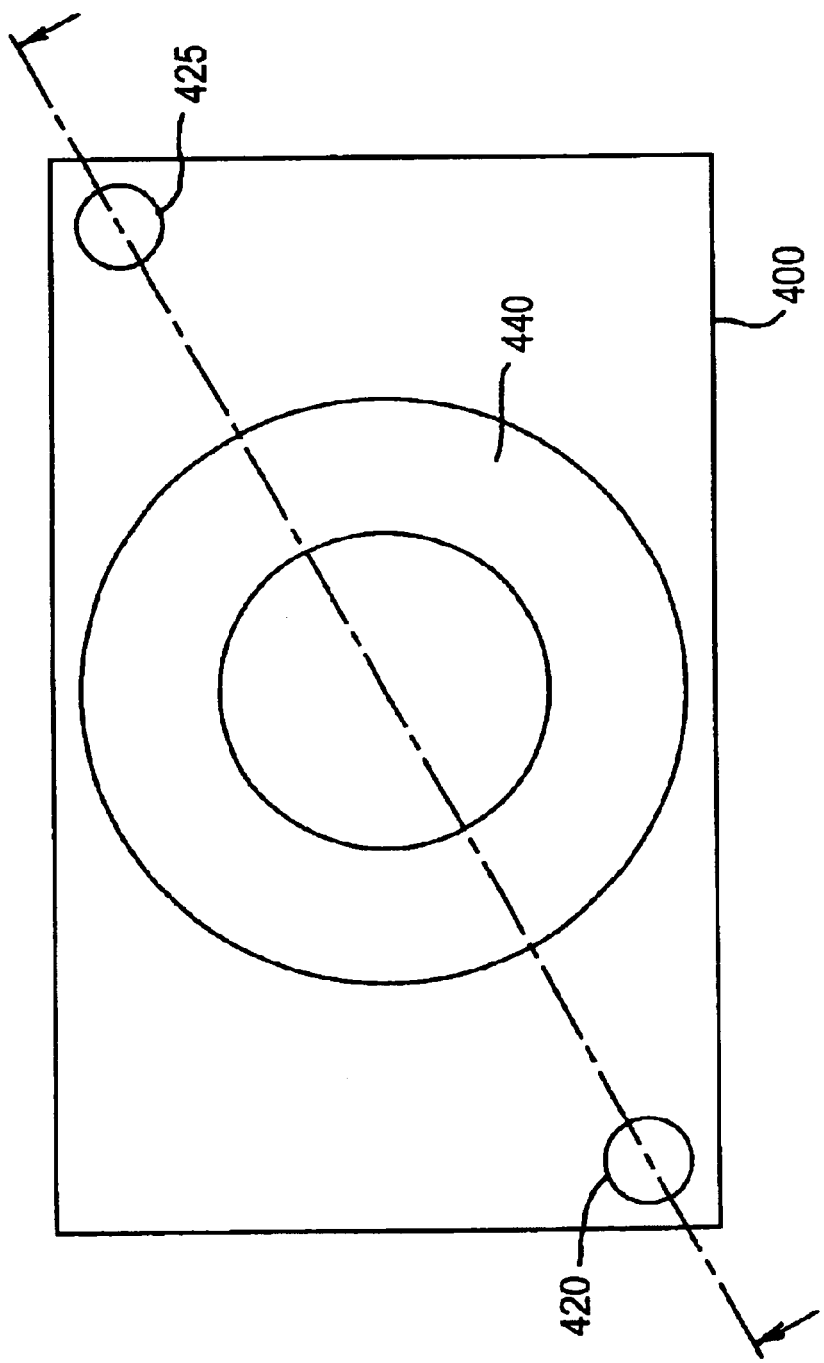
FIG. 20 is a plan view showing the top of the surface mount LED package of FIG. 5 at an early stage of manufacture.

After copper plating, each rectangular unit 400 on the board is drilled with two differently shaped drill bits 430, 450 as illustrated in FIG. 5. With further reference to FIG. 20, two holes 420, 425 at opposite corners of the rectangular unit are drilled using a first cylindrically shaped drill bit 430. These via-like holes 420, 425 extend between the upper and lower surfaces of the board and through the copper plating 410. Additionally, a conical-section shaped recess 440 is drilled in the upper surface of the board centrally on the rectangular unit by a second cylindrically shaped drill bit 450 having a tapered or chamfered end.

The drill bits remove the copper plating 410 in the drilling areas, leaving surfaces of the board exposed in the two holes 420, 425 and in the recess 440. These exposed areas are then coated with a film of graphite such that the whole surface of the unit becomes electrically conductive.

Following the graphite coating, the drilled unit is subjected to a series of photochemical etching processes which selectively deposit metallic layers in predetermined regions on the unit surface. The first photochemical etching processes is illustrated in FIG. 6.

Figure 6:
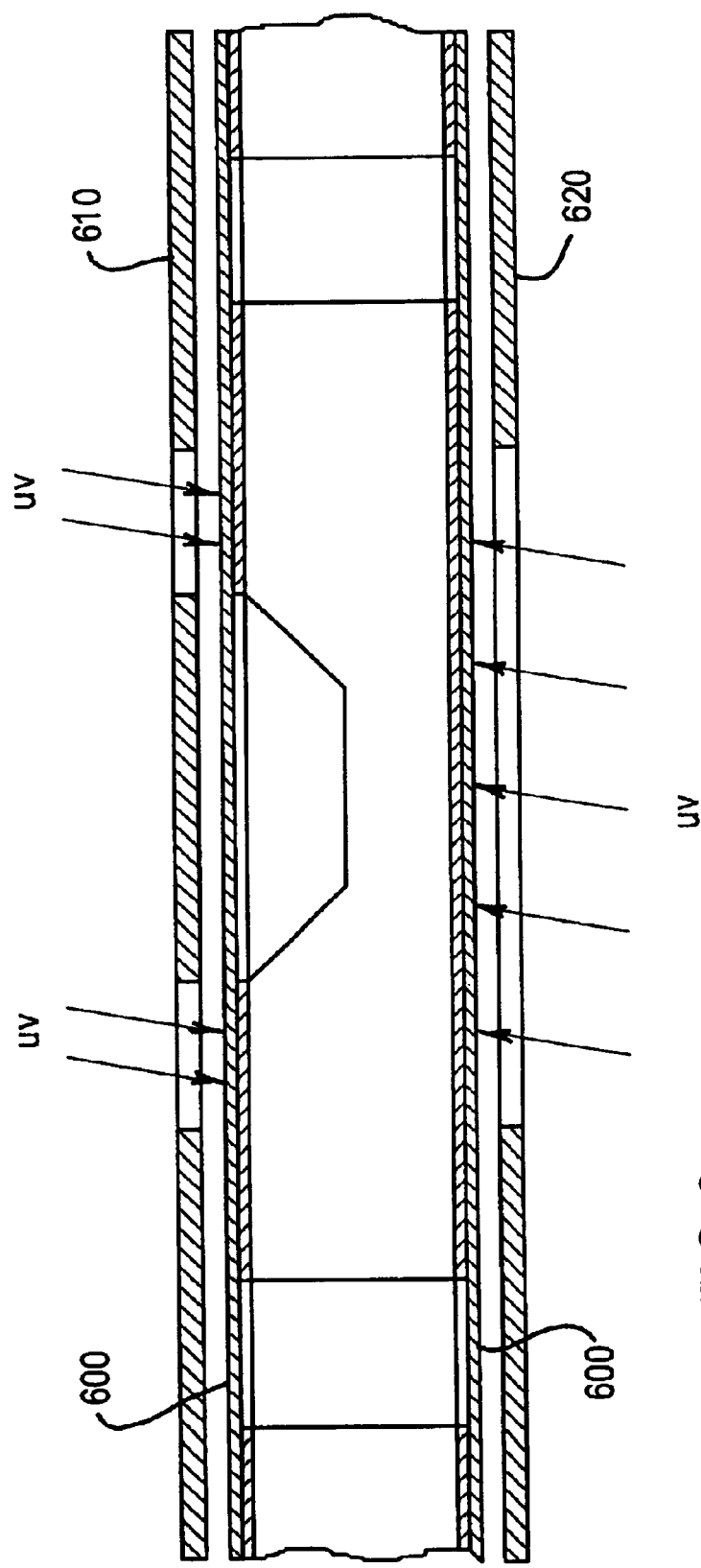

Referring to FIG. 6, the photochemical etching process comprises applying a dry film 600 made from photosensitive resistive material on the upper and lower surfaces of the unit 400. Photomasks 610, 612 are then applied above and below the upper and lower dry films 600 respectively. The photomasks 610, 612, shown respectively in plan in FIGS. 21 and 22, are generally transparent except for opaque regions which define where a metallic layer should be deposited.

Figure 7:
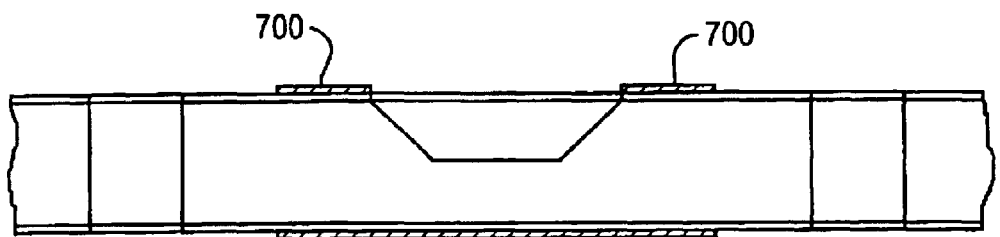

With the photomasks in position on the unit 400, the unit is exposed above and below to ultraviolet (UV) radiation. The regions on the dry film corresponding to the transparent areas on the photomask are selectively hardened by exposure to the UV light. These hardened areas form a chemically-resistant etch mask whilst the unexposed and unhardened regions of the dry film are dissolvable in a suitable etchant, such as chromic acid solution or ferric chloride. Consequently, upon chemically etching away the dry film, an appropriate mask 700 is formed on the upper and lower surfaces of the unit 400 as illustrated in FIG. 7.

Figure 8:
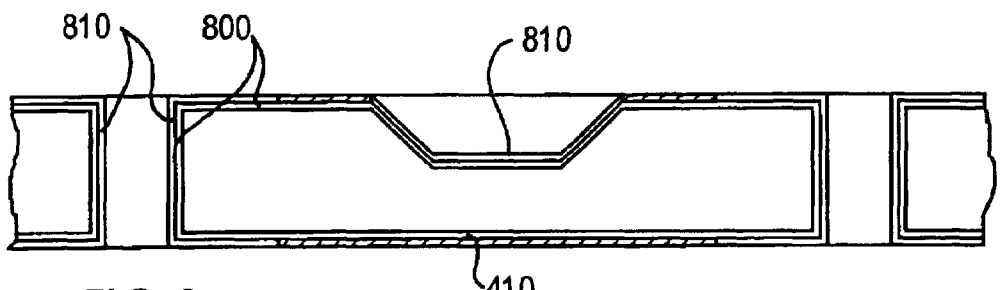

FIG. 8 illustrates the result of electrolytically plating the unit with copper 800 and nickel 810. Because the mask is electrically insulating, no plating occurs over the mask region. In contrast, the remainder of the unit is electrically conductive (including the holes and the recess) and so plating occurs everywhere except the mask region. The plated areas define a pair of interconnections on the upper and lower surface of the unit 400 for the LED die.

Figure 9:
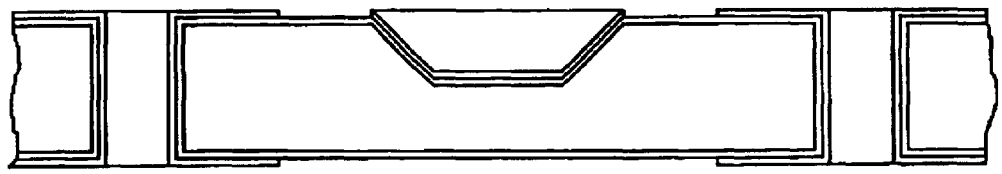
Figure 10:
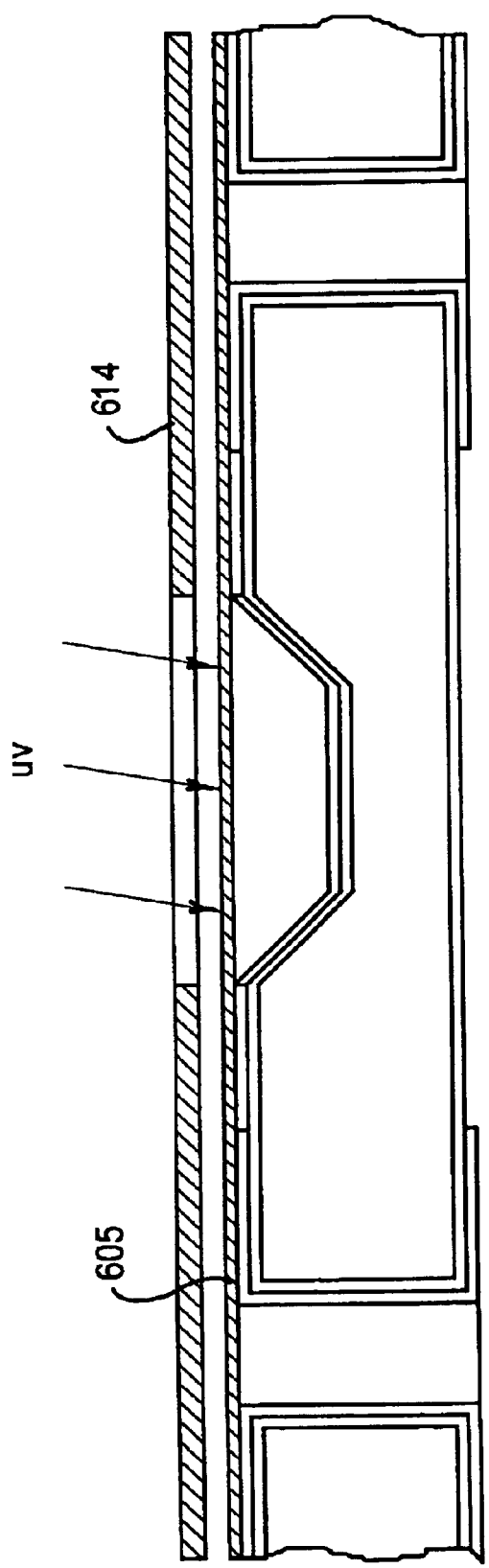

Once the plating process is complete, the hardened mask region can be removed with a suitable hot organic stripper to leave the unit in the form illustrated in FIG. 9.

Figure 11:
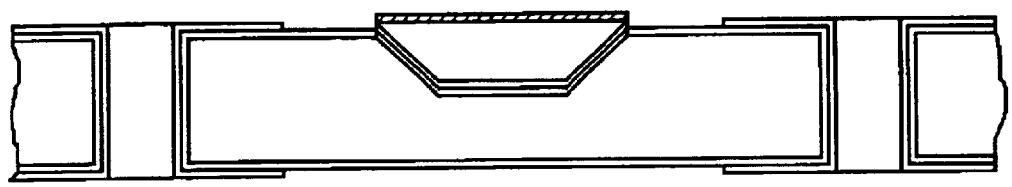

A second photochemical etching process is then applied to the unit 400 on the upper surface only. As before, a dry film 605 made of photosensitive resistive material is applied to the upper surface of the unit 400. A photomask 614, shown in plan in FIG. 23, is then applied over the dry film and the upper surface of the unit 400 is exposed to UV light. The photomask exposes only the recess area to UV light such that the dry film hardens over the recess, and remains in place while the obscured regions are dissolved away by means of a suitable etchant. FIG. 11 shows the result of this photomasking.

Figure 12:
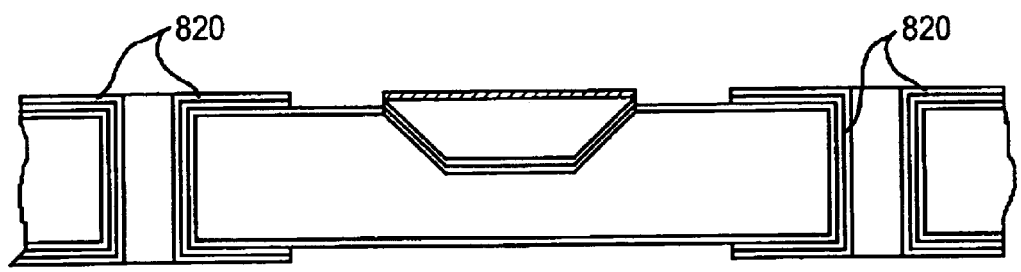
Figure 13:
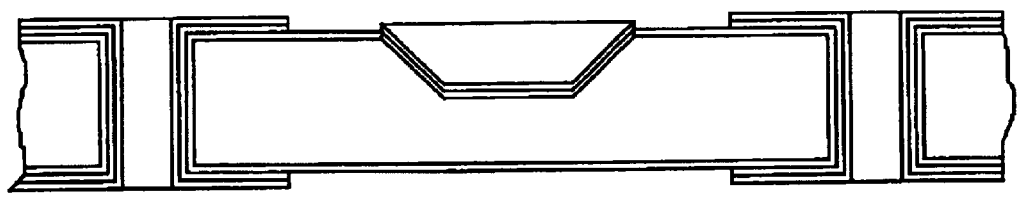

In order to provide improved connectivity to the conductive layers, a coating of flash gold 820 is applied to the unit in FIG. 11. The flash gold only adheres to the nickel plated regions as shown in FIG. 12. However, the recess region does not receive the gold plating due to the hardened dry film masking. Accordingly, the recess advantageously retains the highly reflective quality of the nickel plating. FIG. 13 shows the unit 400 after the hardened mask region has been removed using a suitable hot organic stripper.

Figure 14:
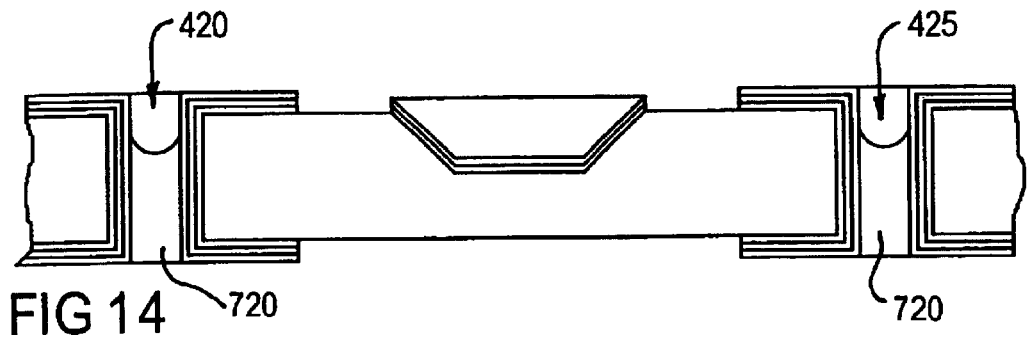

Using a suitable etching chemical, the unwanted copper layers exposed on the outside of the unit 400 are easily removed leaving just the nickel coated recess and the gold coated interconnects as shown in FIG. 14.

The last stage in the board fabrication step 300 is to seal the holes 420, 425 with a thermosetting polymer such as a solder resist. The board is now ready for the die attach step.

Die Attach

Figure 15:
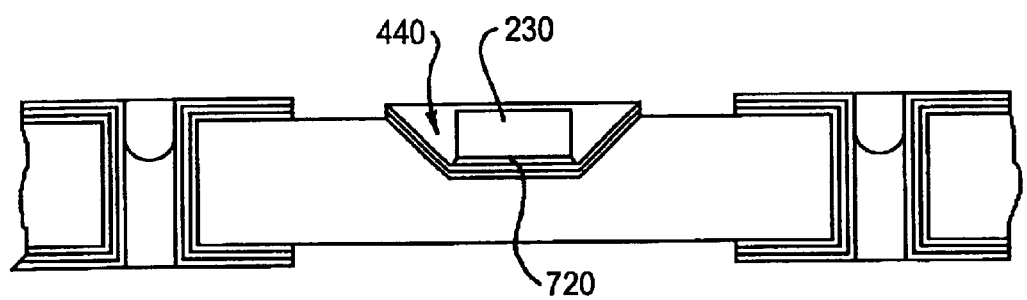

The next step 310 in the manufacturing process is to mount or attach an LED die 230 in the recess 440. The first stage of this die attach step involves dispensing or dotting a small amount of electrically conductive silver epoxy 720 on the floor or base of the recess. The next stage involves picking and placing an LED die 230 onto the silver epoxy in the recess as shown in FIG. 15. The final stage of the die attach step involves curing the silver epoxy together with the rest of the unit 400 in a box oven at approximately 180 degree centigrade for a period of approximately one hour. The cured silver epoxy fixes the die in place in the recess and provides good heat conductivity away from the die.

Wire Bond

A wire bonding step 320 is employed in the present embodiment to electrically couple the two sides of the semiconductor junction of the LED die to two electrically isolated terminals on the upper side of the unit board. The two terminals are provided by the gold plated layers 822, 824 at opposite ends of the unit board.

Figure 16:
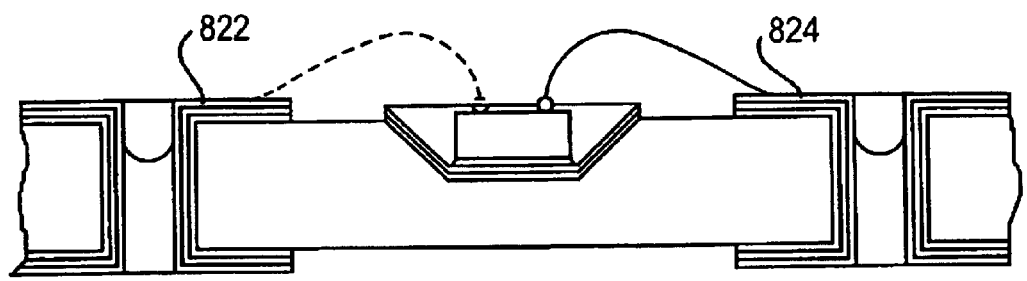

For each of the two wires, the wire bonding process creates a ball joint between one end of gold wire and a bond pad on the LED die, and a wedge joint between the other end of the wire and the gold plated terminal on the unit board. A suitable apparatus and method for forming such a wire bond is described in U.S. Pat. No. 4,600,138. The resulting wire bonded LED die is illustrated in FIG. 16.

Transfer Mold

The batch processing of multiple units is completed in the transfer mold step 330 in which an epoxy encapsulant is molded using a known transfer molding process over the upper surface of the unit 400. The mold is of comparable length and width to the original glass fibre board and comprises an array of ellipsoidal mold cups to compliment the array of units on the board. The mold process includes a first step of clamping the mold onto the upper surface of the board such that the array of mold cups are positioned to compliment the array of units on the board. The second step is to "transfer" a molding compound into the mold cups under elevated temperature and pressure conditions. For example, the molding compound could be an MG18 epoxy, available from Dexter Hysol, USA, which is heated to approximately 155 degrees centigrade and is transferred into the mold under a pressure of 1500 kilo Pascals.

Post Mold Cure

Following the encapsulation step, the array of units undergo a post mold curing step 340 in which the units are baked in a box oven for a period of approximately 3 hours at a temperature of approximately 150 degrees centigrade. This curing step hardens the encapsulation epoxy so that it can withstand exposure to external impact and abrasion.

The cured encapsulant serves to focus light emitted from the LED die but also provides a barrier layer that prevents moisture and other materials from contacting and damaging the LED die 30. The cured encapsulated unit is shown in detail in FIG. 17.

Sawing

Figure 17:
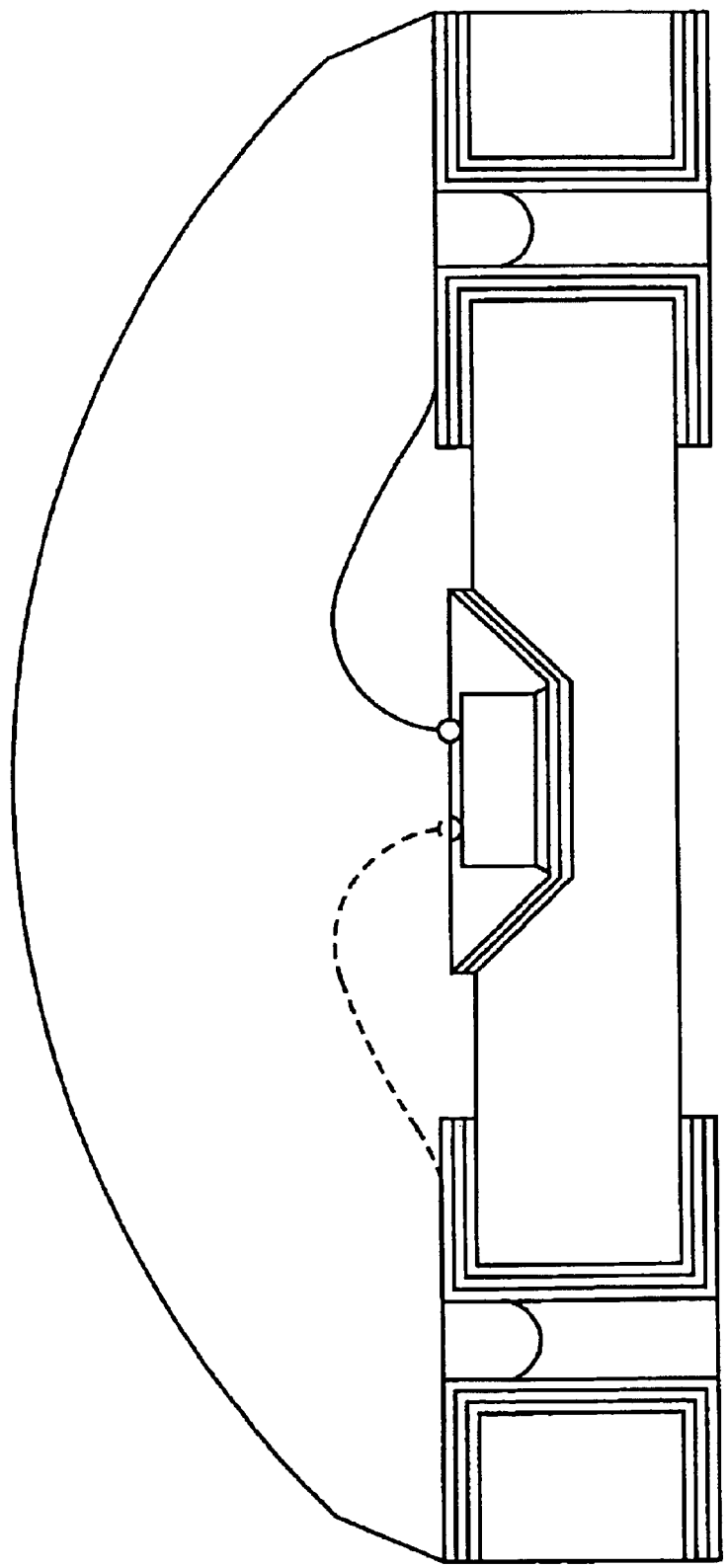

Individual LED packages are produced in the final sawing step in which of individual units on the board array are sawn apart. Preferably, a 0.2 millimeter dicing saw, available from Disco Abrasive Systems Inc., Mountain View, Calif., is used to separate the units. Detail views of the final surface mount LED package are shown in FIGS. 17, 18 and 19.

It is to be understood that within the scope of the appended claims the invention may be practiced otherwise than as specifically described. For example, the nickel plating on the recess which presents a silvered surface to the LED die could be replaced with silver plating to form a silvered surface.

What is claimed is:

1. A light source comprising:

a planar substrate having an upper surface and a lower surface, a portion of the upper surface defining a recess having a side wall tapering outwards towards the upper surface, the substrate defining first and second vias extending between the upper and lower surfaces, a light emitting diode mounted in the recess of the substrate adjacent the side walls, a first electrically-conductive interconnect extending between the upper and lower surfaces, the first interconnect having a terminal on the upper surface coupled to the light emitting diode and an exposed pad on the lower surface for coupling to external circuitry, a second electrically-conductive interconnect extending between the upper and lower surfaces, the second interconnect having a terminal on the upper surface coupled to the light emitting diode and a conductive pad on the lower surface for coupling to external circuitry, a portion of each of the first and second interconnects extending through the first and second vias respectively, and a transparent encapsulated material bonded to the first surface of the substrate to encapsulate the light emitting diode, the material being molded to form an ellipsoidal dome over the light emitting diode.

2. A light source comprising:

a planar substrate having an upper surface and a lower surface, a portion of the upper surface defining a recess having a side wall tapering outwards towards the upper surface, a light emitting diode mounted in the recess of the substrate adjacent the side walls, a first electrically-conductive interconnect extending between the upper and lower surfaces, the first interconnect having a terminal on the upper surface coupled to the light emitting diode and exposed pad on the lower surface for coupling to external circuitry, a second electrically-conductive interconnect extending between the upper and lower surface, the second interconnect having a terminal on the upper surface coupled to the light emitting diode and a conductive pad on the lower surface for coupling to external circuitry, and a transparent encapsulate material bonded to the first surface of the substrate to encapsulate the light emitting diode the material being molded to form an ellipsoidal dome over the light emitting diode, the ellipsoidal dome having a major axis equal to the length of the planar substrate and a minor axis equal to the width of the substrate.

* * * * *